(12) United States Patent
Sugawara

(10) Patent No.: US 6,538,265 B1
(45) Date of Patent: Mar. 25, 2003

(54) INDIUM ALUMINUM NITRIDE BASED LIGHT EMITTER ACTIVE LAYER WITH INDIUM RICH AND ALUMINUM RICH AREAS

(75) Inventor: Hideto Sugawara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/394,242

(22) Filed: Sep. 13, 1999

(30) Foreign Application Priority Data

Mar. 12, 1999 (JP) .......................................... 11-067001

(51) Int. Cl.$^7$ ................................................ H01L 33/00
(52) U.S. Cl. ............................ 257/103; 257/94; 257/96
(58) Field of Search ............................ 257/14, 22, 103, 257/96, 97, 613, 615, 16

(56) References Cited

U.S. PATENT DOCUMENTS

| | | | | |
|---|---|---|---|---|
| 5,670,798 A | * | 9/1997 | Schetzina | 257/96 |
| 5,780,876 A | | 7/1998 | Hata | |
| 5,886,367 A | * | 3/1999 | Udagawa | 257/64 |
| 5,959,307 A | * | 9/1999 | Nakamura et al. | 257/14 |
| 6,121,634 A | * | 9/2000 | Saito et al. | 257/86 |
| 6,153,010 A | * | 11/2000 | Kiyoku et al. | 117/95 |
| 6,270,569 B1 | * | 8/2001 | Shibata et al. | 117/68 |

* cited by examiner

*Primary Examiner*—Eddie Lee
*Assistant Examiner*—Bradley W. Baumeister
(74) *Attorney, Agent, or Firm*—Hogan & Hartson, LLP

(57) ABSTRACT

A nitride compound semiconductor light-emitting device having a stack of layers including an active layer for a light emitting device and a method of manufacturing the device is disclosed. The method includes the steps of growing a first layer on a substrate at a first temperature to obtain an incomplete crystalline structure including both indium and aluminum and having the composition expressed as $In_X Al_Y Ga_{1-X-Y}N$ ($0 \leq X \leq 1$, $0 \leq Y \leq 1$). The method grows a cap layer on the first layer to cover the first layer, with growth of the cap layer proceeding at a second temperature substantially equal to or below the first temperature. The first layer is heat treated at a third temperature above the first temperature to cause the incomplete crystalline structure to crystallize and to create areas of differing compositions, thus changing the first layer to an active layer. The material of the cap layer is selected to be heat stable during the heat-treating step.

4 Claims, 1 Drawing Sheet

INDIUM ALUMINUM NITRIDE BASED LIGHT EMITTER ACTIVE LAYER WITH INDIUM RICH AND ALUMINUM RICH AREAS

BACKGROUND OF THE INVENTION

1. Field of the Invention

This invention generally relates to a gallium nitride (GaN) compound semiconductor and to gallium nitride semiconductor light emitting diodes (LEDs) or semiconductor laser diodes. More particularly, the invention relates to LEDs or semiconductor lasers that include within their active region a layer of indium rich nitride. The presence of such an active layer within such a device can allow an LED or laser to output red light. This invention also relates to a method of manufacturing an active layer comprising an indium rich region and LEDs and lasers including such an active layer.

2. Description of the Related Art

Gallium nitride compound semiconductors and more specifically indium-aluminum-gallium nitride (InAlGaN) compound semiconductors are direct transition or direct bandgap semiconductors capable of efficiently producing high levels of luminosity. The bandgap of InAlGaN compound semiconductors can be adjusted between about 1.89 eV and about 6.2 eV by varying the composition of these semiconductors. Since the wavelength of output light varies with the bandgap of material within the active region for InAlGaN semiconductors, widely varying wavelengths of output light can be obtained by using different compositions of InAlGaN semiconductors in the active region of a light emitting device. Such devices are also considered to be good candidates for producing short wavelength light output. Few possibilities exist for producing short wavelength light output from a semiconductor device. Consequently, research has been directed to developing short and visible wavelength lasers and high luminosity light emitting devices employing gallium nitride compound semiconductors.

InAlGaN compound semiconductors are formed basically by combining in the deposition process the following binary compounds: gallium nitride (GaN), aluminum nitride (AlN) and indium nitride (InN). Gallium nitride is the most difficult of these materials to work with and has consequently been the subject of the most research. Gallium nitride has a high melting point of about 1700° C. and nitrogen has an extremely high equilibrium vapor pressure at the temperatures appropriate to growing gallium nitride, which makes growing single crystal gallium nitride difficult. Because of the difficulty of growing single crystal gallium nitride, advanced thin film growth techniques have been used, including hydride vapor phase epitaxial (VPE) growth or metal organic chemical vapor deposition (MOCVD). MOCVD has been studied extensively and can be applied to grow single crystal films of the binary compounds. Adding indium or aluminum during the growth of gallium nitride grows the ternary compound indium gallium nitride ($In_xGa_{1-x}N$) or aluminum gallium nitride ($Al_yGa_{1-y}N$). By using these ternary materials in the heterostructure active region of a light emitting device, the efficiency of light generation can be increased over simpler light emitting device structures. Furthermore, by forming a double heterostructure active region to more effectively confine both the injected carriers and the light generated in the active region, a high luminance semiconductor LED or a short wavelength semiconductor laser diode can be obtained.

By increasing the mole fraction X of indium in the compound, the bandgap of $In_xGa_{1-x}N$ can be changed from about 3.4 eV, the bandgap of GaN, to about 1.89 eV, the bandgap of InN. Consequently, light-emitting devices can use $In_xGa_{1-x}N$ in their active regions to produce visible light output. The ternary compound $In_xGa_{1-x}N$ is obtained by simultaneously depositing gallium nitride and indium nitride while setting the deposition gas mixing conditions to achieve the desired composition.

The differences in the typical growth conditions for gallium nitride and indium nitride make growth of the ternary compound difficult. For example, higher quality crystalline gallium nitride films result from growth temperatures of over 1000° C., while a much lower temperature is appropriate to grow indium nitride crystals. For this reason, $In_xGa_{1-x}N$, with a high mole fraction X, is typically grown at a temperature well below the growth temperature for GaN (Appl. Phys. Lett. 59(18), p.2251, Oct. 28, 1991). Research on the application of $In_xGa_{1-x}N$ as the active layer for an LED emitting blue light, X=0.2, and green light, X=0.45, has been reported and such an LED has almost reached commercial production. (Jpn. J. Appl. Phys., Vol. 34 (1995), pp. L1332–L1335, part. 2, No. 10B, Oct. 15, 1995). However, if the proportion of indium in $In_xGa_{1-x}N$ is increased for the purpose of emitting a larger-wavelength red light, the quality of crystals of InGaN degrades and the output intensity and conversion efficiency declines correspondingly. The difficulty of making InGaN of selected compositions has prevented from being successfully commercialized for longer-wavelength light emitting devices. InGaN LEDs with an emission wavelength of 594 nm are reported to have been developed, and this apparently is the longest wavelength ever achieved so far(Jpn. J. Appl. Phys., Vol. 37 (1998), pp. L479–L481, part. 2, No. 5A, May 1, 1998).

Indium aluminum nitride ($In_yAl_{1-y}N$), formed from the constituents of InN and AlN, has also been studied and found to have potential for use as the active region material for an optical device emitting visible light. There is, however, a mismatch between the lattice constants of InN and AlN that makes it difficult to form heterostructures between these materials and that causes the ternary compound crystals to have internal strains. Also, there is a gap between the equilibrium vapor pressures for the two binary compounds InN and AlN. At the high temperature at which AlN crystals are typically grown, InN evaporates. This introduces further difficulty in growing $In_yAl_{1-y}N$ crystalline structures, as illustrated in T. Matsuoka, Proc. of ICN '97 at 20 (Oct. 1997, Tokushima, Japan).

U.S. Pat. No. 5,780,876 to T. Hata describes the use of an evaporation preventing layer to prevent indium evaporation from an indium gallium nitride compound semiconductor. For example $Al_{0.05}Ga_{0.95}N$ can be deposited at a reduced temperature over an $In_{0.2}Ga_{0.8}N$ compound semiconductor layer to prevent indium from evaporating from the $In_{0.2}Ga_{0.8}N$ active layer during subsequent processing. If not prevented, evaporation of indium from the active region leads to degradation of the interface between the active layer and the upper cladding layer. Such evaporation makes it difficult to control the crystal composition and thickness of the active layer.

Other efforts to facilitate the growth of heterostructures of InAlGaN have not yet been successful. For example, research on the microwave enhanced metal organic vapor phase epitaxial growth method, MOVPE, which would grow InN crystalline structures at lower temperatures, has been under way. At this time, the method has not been validated and the InN grown using this technique does not have satisfactory properties for efficient light emission.

Nitride compound semiconductors including indium have so far failed to realize their high potential for use as materials for the active regions of semiconductor devices emitting red light. Consequently, these materials have not yet achieved practical commercial use, due in large part to the fact that the technology for growing high quality crystal films of the indium-rich nitride compounds has not been established.

SUMMARY OF THE PREFERRED EMBODIMENTS

"It is an object of the present invention to provide an indium-rich nitride compound for use as an active layer in an optical device to permit the device to emit red light having a peak wavelength greater than or equal to 630 nm, to provide LEDs and semiconductor lasers employing such nitride compound, and to provide a method for manufacturing such nitride compound.

A preferred aspect of the present invention provides a nitride compound semiconductor with a mixture of areas including areas where the composition is indium-rich and is expressed as $In_{X1}Al_{Y1}Ga_{1-X1-Y1}N$ ($0<X1 \leq 1$, $0 \leq Y1<1$) and other areas where the composition is aluminum-rich and is expressed as $In_{X2}Al_{Y2}Ga_{1-X2-Y2}N$ ($0<X2<X1 \leq 1$, $Y1<Y2 \leq 1$).

Another aspect of the present invention provides a nitride compound semiconductor light emitting device having a stack of layers including an active layer, the composition of each layer being expressed as $In_XAl_YGa_{1-X-Y}N$ ($0 \leq X \leq 1$, $0 \leq Y \leq 1$). The composition of the active layer preferably comprises areas where the composition is indium-rich and is expressed as $In_{X1}Al_{Y1}Ga_{1-X1-Y1}N$ ($0<X1 \leq 1$, $0 \leq Y1<1$) and other areas where the composition is aluminum-rich and is expressed as $In_{X2}Al_{Y2}Ga_{1-X2-Y2}N$ ($0<X2<X1 \leq 1$, $Y1<Y2 \leq 1$)."

Still another aspect of the present invention provides a method of manufacturing a nitride compound semiconductor light emitting device having a stack of layers. A first layer is grown at a first temperature to obtain an incomplete crystalline structure including both indium and aluminum with the composition expressed as $In_XAl_YGa_{1-X-Y}N$ ($0 \leq X \leq 1$, $0 \leq Y \leq 1$). The method grows a cap layer on the first layer to cover the first layer at a second temperature lower than the first temperature. The first layer is heated to a third temperature greater than the first temperature to cause the incomplete crystalline structure of the first layer to crystallize and to create separate areas of differing compositions. In preferred embodiments of the method, the material of the cap layer is selected as to be heat stable during the heating step.

"Yet another aspect of the present invention provides a method of manufacturing a nitride compound semiconductor light emitting device having a stack of layers. The method grows a first layer at a first temperature to obtain an incomplete crystalline structure, including both indium and aluminum with the composition of the first layer expressed as $In_XAl_YGa_{1-X-Y}N$ ($0<X<1$, $0<Y<1$). The method then grows a cap layer on the first layer to cover the first layer, with the growth proceeding at a second temperature below the first temperature. The first layer is heated at a third temperature above the first temperature to cause the incomplete crystalline structures of the first layer to form an active layer. The material of the cap layer is selected to be stable during the heating step.

Another aspect of the invention provides a method of manufacturing a nitride compound semiconductor light emitting device with a stack of layers having a cladding layer. A first layer is grown on the cladding layer at a first temperature to obtain an incomplete crystalline structure including both indium and aluminum with the composition of the first layer expressed as $In_XAl_YGa_{1-X-Y}N$ ($0<X<1$, $0<Y<1$). The method grows a cap layer on the first layer to cover the first layer, with the cap layer grown at a second temperature below the first temperature. The first layer is heated at a third temperature above the first temperature to cause the incomplete crystalline structure of the first layer to form an active layer. The material of the cap layer is selected to be stable during the heating step."

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

Preferred embodiments of the present invention provide an active region having a mixed composition InAlGaN semiconductor. Mixed composition here refers broadly to an active layer having different compositions within the layer. In refined embodiments of the invention, the mixed composition regions might be well defined; in other embodiments, the mixed composition regions may not be well defined. Most preferably, certain of the mixed composition regions are indium rich and others of the mixed composition regions are aluminum rich. This mixed composition structure arises, in preferred embodiments of the invention, as a natural consequence of the preferred growth technique. A mixed composition layer including indium rich regions is particularly useful as an efficient active region for outputting red light.

Other aspects of the invention provide preferred methods for producing an indium-rich InAlGaN active region or a device including such an active region. With these preferred methods, an incompletely crystalline layer of, for example, InAlN, is deposited at a first temperature on an appropriate nitride substrate. A cap layer is provided over the incompletely crystalline layer and a heat treatment is performed. Preferably the cap layer is stable to the temperature of the heat treatment and the temperature and duration of the heat treatment are sufficient to crystallize the incompletely crystalline layer so that it is transformed into an active layer. This allows an InAlGaN semiconductor having indium rich regions to be formed with reduced indium loss so that the semiconductor can be used as an active region of a light emitting device.

Figure 1:
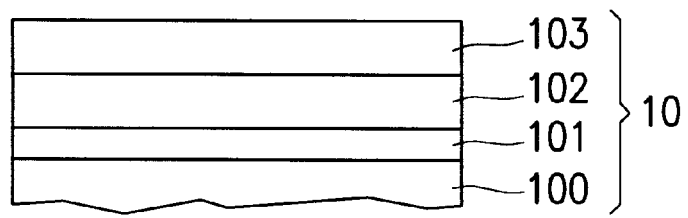
FIG. 1 is a cross-sectional view schematically illustrating a nitride compound semiconductor in accordance with the present invention.

Embodiments of the present invention are described in further detail with reference to the drawings. FIG. 1 shows a cross-sectional view schematically illustrating the nitride compound semiconductor of the present invention. A stack of layers 10 according to this invention includes a gallium nitride (GaN) layer 100, an indium aluminum nitride (InAlN) layer 101 formed on the GaN layer 100, an aluminum gallium nitride (AlGaN) layer 102 formed on the InAlN layer 101, and a gallium nitride contact layer 103 formed on the AlGaN layer 102. In the illustrated embodiment, heterojunctions are formed between the GaN layer 100 and the InAlN layer 101 and between the InAlN layer 101 and the AlGaN layer 102. Accordingly, the illustrated structure provides a double heterojunction with the InAlN layer 101 as an active layer, and both the GaN layer 100 and the AlGaN layer 102 as cladding layers. It is not essential to provide the lower GaN cladding layer within the stack of layers 10. A layer of any other nitride compound semiconductor material can be used as long as it provides a suitably lattice-matched structure for growth of the InAlN crystalline structure. Alternatively, other types of substrates may be used for the growth of the InAlN layer 101 and the AlGaN layer 102, so that only a single heterojunction is formed between the InAlN layer 101 and the AlGaN layer 102. Regardless, it is preferred that the illustrated InAlN layer 101 be formed on a layer having a surface compatible with the growth of high quality InAlN films.

InAlN layer 101 plays a significant role in optical devices such as that illustrated in FIG. 1, since InAlN layer 101 includes at least a portion of the active region of the light-emitting device. Here, the active region may be functionally defined as that portion of a semiconductor device in which carrier transitions take place to generate light. The structure of InAlN layer 101, which comprises a mixed body with an indium-rich composition portion and an aluminum-rich composition portion, relates to a particularly preferred aspect of the present invention. Among other preferred aspects, the structure of InAlN layer 101 provides an active region well suited for the efficient production of light over a desired range of wavelengths. Methods described here that facilitate the reliable production of the InAlN layer 101 represent other particularly preferred aspects of the present invention.

Next, a method for manufacturing the InAlN layer 101 shown in FIG. 1 is described in greater detail as an illustration of preferred methods for manufacturing a nitride compound semiconductor in accordance with the present invention.

A stack of layers 10 which includes an InAlN layer 101 is preferably grown by metal organic chemical vapor deposition (MOCVD). Ammonia ($NH_3$), ionized nitrogen generated through plasma enhancement processes, or hydrazine ($H_2NNH_2$) may be used as a source for nitrogen in the MOCVD growth process, and nitrogen preferably is used as a carrier gas. However, as mentioned above, because there is a mismatch in the lattice constants and the equilibrium vapor pressures between InN and AlN, it is difficult to grow a monocrystalline structure directly through use of conventional MOCVD techniques.

According to a preferred aspect of a method for manufacturing the nitride compound semiconductor of the present invention, an InAlN layer is grown on a GaN body at a first temperature, so that the InAlN layer is deposited as an incomplete crystal structure, but containing both indium and aluminum. At this stage it is preferred that some or all of the InAlN layer structure form either amorphous or minute multicrystal structures. In this regard, an incomplete crystal structure is one that may have one or more amorphous, polycrystalline, multiphase or nonuniform composition regions. An incomplete crystal structure stands in contrast to an epitaxial layer of sufficient crystalline quality to serve as the active region of an efficient light generating device. Subsequently, the method forms a cap layer over the InAlN layer, preferably directly on the InAlN layer, where the cap layer is preferably selected to be stable during a preferred subsequent heating step. The subsequent heating step most preferably is conducted at a temperature sufficient to at least partially crystallize portions of the InAlN layer. Thus, it is preferred that the cap layer be stable to a level of heat appropriate to transform the InAlN layer. After the cap layer has been formed, the method next applies heat to the InAlN layer to bring the temperature to a point higher than the first temperature to transform the InAlN layer to a mixed body of differing compositions. Due to the apparent thermodynamics of this ternary system, crystallization proceeds along with segregation of the ternary compound into indium rich regions and aluminum rich regions.

A still more detailed process for manufacturing preferred semiconductor layer structures is now described. The InAlN layer 101 is grown by MOCVD at about 500° C. on the GaN layer of FIG. 1. It has been confirmed by observation that at this stage at least a portion of the InAlN layer comprises amorphous or minute multicrystals. Next, an AlGaN layer 102 is grown by MOCVD on the InAlN layer 101 at about 500° C. to cover the layer. Here, the AlGaN layer 102 is called the cap layer because it caps or covers the InAlN layer 101. It should be appreciated that the temperatures listed here are exemplary and can be varied in the familiar manner. After formation of the cap layer, the temperature of the device is preferably increased to about 1000° C. and a GaN layer 103 is preferably grown on the AlGaN cap layer 102, thereby completing the stack of layers 10 shown in this illustrated embodiment.

During the heat application process, the incomplete crystal structure in the InAlN layer 101 is subjected to heat annealing and hence the stabilization of the layer with respect to temperature will take place. Therefore, during the time the growth of the GaN layer 103 proceeds, the crystallization of the InAlN layer 101 advances and, at the same time within the same layer, the mixed regions develop including at least one indium-rich composition region and at least one aluminum-rich composition region. The separation of the regions is preferably maintained even after the temperature is brought down to room temperature. The layer 101 may contain Gallium and therefore, can become InAlGaN layer. The separation of the regions can still occur within the InAlGaN layer, but, the separation develops better without Gallium than with Gallium.

During the process, the AlGaN cap layer 102, which is grown on the InAlN layer 101, preferably also plays a significant role. If the temperature were to be elevated soon after the InAlN layer 101 is grown, the indium within the unstabilized structure of the InAlN layer 101 would cohere and combine to form In droplets. The high temperature would also help indium to evaporate, preventing the unstabilized structure of the as-deposited InAlN layer from forming the desired mixed composition discussed above. It has been found that, since the AlGaN cap layer 102 covers the InAlN layer 101 in this embodiment, the formation of a condensed In droplets can be prevented. The shielding effect of the cap layer facilitates the provision of an improved indium-rich composition and indium nitride compound within the illustrated structure. Also, by changing the patterning of the cap layer in accordance with a desired pattern for the formation of the nitride compound capable of emitting red light, the optical output of the device can be distributed to desired locations. In other words, because the cap layer is needed to produce the red light emitting nitride compound, the pattern of the cap layer determines the pattern of light emitted by the device. Therefore, a greater level of flexibility or freedom of design is provided for the illustrated type of nitride compound semiconductor device.

It can be inferred that the interplay of the InAlN layer 101 and the AlGaN cap layer 102, including the growth of the latter layer on the former, has some effect on the crystallization process of the InAlN layer during the subsequent heat annealing step. At this time, however, the particular mechanism has not been elucidated. The AlGaN has been selected as the material for the cap layer in this embodiment of the invention because it is relatively stable with respect to heat at the high temperatures at which InAlN layer 101 is crystallized and forms separate composition regions.

It was observed that when the carriers in the stack of layer 10 are excited by means of an electron beam, red light was emitted from the indium-rich portion of the InAlN layer 101. The phenomenon might be explained as follows. Carriers are excited and injected into the indium-rich composition regions since the indium-rich composition regions represent the smallest energy bandgap between the valence band and the conduction band in the stack of layers 10. Therefore, by providing the stack of layers 10 according to the described method, a nitride compound semiconductor in accordance with an embodiment of the present invention was observed to emit red light. The ratio of indium to aluminum in the indium-rich regions of the InAlN layer 101 was determined to be approximately forty-nine to one (49:1) by energy dispersive X-ray (EDX) detection analysis.

Figure 2:
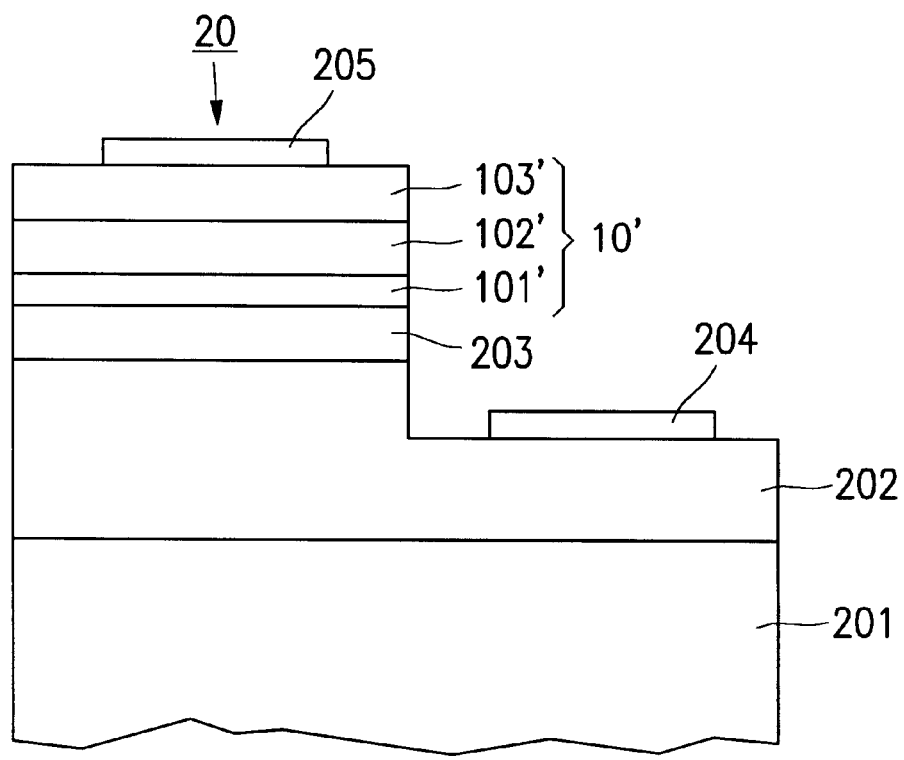
FIG. 2 is a cross-sectional view schematically illustrating a semiconductor light-emitting device including a nitride compound semiconductor in accordance with the present invention.

Next, the nitride compound semiconductor light emitting device according to the invention will be described with reference to FIG. 2 of the drawings. FIG. 2 shows a schematic cross sectional view of the nitride compound semiconductor light emitting device 20 pursuant to preferred embodiments of the invention. The light emitting device 20 in FIG. 2 includes a sapphire substrate 201, an n-type GaN layer 202 formed on the sapphire substrate 201, an n-type AlGaN layer 203 formed on the GaN layer 202 as a first cladding layer, and a stack of layers 10' formed on the AlGaN layer 203.

The stack of layers 10' preferably includes a nitride compound semiconductor 101' produced in accordance with a preferred embodiment of the invention. In FIG. 2, like elements have like references to those shown in FIG. 1. The stack of layers 10' further includes a p-type AlGaN layer 102' formed on the nitride compound semiconductor 101' and a p-type GaN 103' formed on the AlGaN layer 102', similar to the construction of the stack of layers 10 in FIG. 1. The p-type AlGaN layer 102' functions as a second cladding layer. The light emitting device 20 further includes an n-type electrode 204 provided on, but removed from, the n-type AlGaN layer 203, the n-type GaN layer 202, and a p-type electrode 205 formed on the stack of layers 10'. As shown in FIG. 2, a portion of the GaN layer 202 is stripped off of the AlGaN layer 203 and the stack of layers 10 to provide the electrode 204.

A method for manufacturing the light emitting device 20 according to the embodiment of the invention shown in FIG. 2 is now described.

After an n-type GaN layer 202 and an n-type AlGaN layer 203 are formed on the sapphire substrate 201 by the conventional method, the stack of layers 10' is formed on the AlGaN layer 203. The method of fabricating the stack of layers 10' is generally the same as described above. The nitride compound semiconductor layer 101' and the p-type AlGaN layer 102' are grown, preferably by MOCVD at about 450° C., and the p-type GaN layer 103' is grown, preferably by MOCVD at about 1000° C. Then, by means of conventional optical lithography using photoresist, a portion of the stacked layer above the GaN layer 202 along the perpendicular direction is selectively removed. After the photoresist is dissolved, ashed or otherwise removed, an n-type electrode 204 is provided on the GaN layer 202. A p-type electrode 205 is also provided on the p-type GaN layer 103', thus completing the light emitting device 20 as shown in FIG. 2.

Just as described earlier with respect to the nitride compound semiconductor 10 in FIG. 1, the inventor observed the emission of red light, with the wavelength of 630 nm and an output power of 0.5 mW at an operation current of 20 mA, from the InAlN layer 101' in FIG. 2 when the appropriate voltage was supplied across the electrodes 204 and 205. This indicates that the indium-rich composition region was properly formed in the InAlN layer 101' and the injected carriers were effectively confined within the region.

While there has been illustrated and described what are presently considered to be preferred embodiments of a nitride compound semiconductor in accordance with the present invention and light emitting devices employing the semiconductor, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof.

Therefore, it is intended that this invention not be limited to the particular embodiment disclosed as the best mode contemplated for carrying out this invention, but that the invention include all embodiments falling within the scope of the appended claims.

What is claimed is:

1. A nitride compound semiconductor light emitting device having a stack of layers including an active layer, a composition of each layer being expressed as $In_XAl_YGa_{1-X-Y}N$ ($0 \leq X \leq 1$, $0 \leq Y \leq 1$) and the active layer with a mixed composition comprising areas where the composition is expressed as $In_{X1}Al_{1-X1}N$ ($0<X1<1$) and other areas where the composition is expressed as $In_{X2}Al_{1-X2}N$ ($0 \leq X2<X1<1$), wherein said areas where the composition is expressed as $In_{X1}Al_{1-X1}N$ ($0<X1<1$) emit red light with a peak wavelength greater than or equal to 630 nm.

2. A nitride compound semiconductor light emitting device according to claim 1, further comprising:

a cap layer containing AlGaN on said active layer.

3. A nitride compound semiconductor with a mixed composition including areas where the composition is expressed as $In_{X1}Al_{1-X1}N$ ($0<X1<1$) and other areas where the composition is expressed as $In_{X2}Al_{1-X2}N$ ($0 \leq X2<X1<1$), wherein said areas where the composition is expressed as $In_{X1}Al_{1-X1}N$ ($0<X1<1$) emit red light with a peak wavelength greater than or equal to 630 nm.

4. A nitride compound semiconductor according to claim 3, comprising:

a cap layer made of AlGaN on said mixed composition including said areas where the composition is expressed as $In_{X2}Al_{1-X2}N$ ($0 \leq X2<X1<1$) and said other areas where it is expressed as $In_{X1}Al_{1-X1}N$ ($0<X1<1$).

* * * * *